United States Patent [19]

Shibasaka et al.

[11] Patent Number: 5,156,319
[45] Date of Patent: Oct. 20, 1992

[54] WIRE BONDING INSPECTION EQUIPMENT

[75] Inventors: Mitsusada Shibasaka, Fujisawa; Yuichi Miyahara, Kawasaki, both of Japan

[73] Assignee: Kabushiki Kaisha Toshiba, Kawasaki, Japan

[21] Appl. No.: 758,110

[22] Filed: Sep. 12, 1991

[30] Foreign Application Priority Data

Sep. 14, 1990 [JP] Japan .................. 65-245397

[51] Int. Cl.$^5$ .............. B23K 37/00; B23K 31/12
[52] U.S. Cl. ........................... 228/9; 228/4.5; 228/104
[58] Field of Search ........... 228/4.5, 9, 56.5, 104, 228/105

[56] References Cited

U.S. PATENT DOCUMENTS 5,007,576 4/1991 Congleton et al. .............. 228/104
5,029,747 7/1991 Russo et al. .................... 228/4.5

FOREIGN PATENT DOCUMENTS 2-106049 4/1990 Japan ..................... 228/4.5

*Primary Examiner*—Richard K. Seidel
*Assistant Examiner*—Jeffrey T. Knapp
*Attorney, Agent, or Firm*—Foley & Lardner

[57] ABSTRACT

Wire bonding inspection equipment includes a judging unit for judging whether or not wire bonding of a semiconductor device is acceptabe and for producing a defect signal when the semiconductor device is judged to be defective. In response to the defect signal wires of the defective semiconductor device are broken by a breaking unit, and a defect mark is applied on the defective semiconductor device by a defective mark putting unit in response to the defect signal, the defect mark applying unit applying the defect mark on an area other than an area to be covered with sealing material.

4 Claims, 2 Drawing Sheets

WIRE BONDING INSPECTION EQUIPMENT

BACKGROUND OF THE INVENTION

The present invention relates to wire bonding inspection equipment, and particularly to wire bonding inspection equipment which automatically inspects the state of wire bonding of each semiconductor device after a wire bonding step for such a semiconductor device has been performed.

Semiconductor devices, such as an integrated circuit chip, are wire bonded to a surrounding member such as a lead frame. After a judgement as to whether or not the wire bonding is acceptable, the semiconductor devices are sealed with a sealing material. Heretofore, inspection of the wire bonding conducted by visual observation. Only defective wires were removed, and the removed wire portions were restored again by wire bonding. Nonrestorable semiconductors are destroyed by manually breaking all the bonding wires thereof and are detected in a subsequent functional test step for removal.

It is, however, preferable to break all the wires as nonrestorable wires when any defect is found in at least part of the many wires which are wire bonded since there is a relatively high possibility of wires of restored semiconductor devices being separated during use after shipment.

In the conventional inspection step, wires are manually broken, and hence the inspection takes a great deal of time, and moreover workers are liable to mistake defective articles for non-defective articles and non-defective ones as defective ones. It is not possible to distinguish defective articles based on the appearance thereof when semiconductor devices are sealed with a sealing material after wires are broken. Thus, it is not possible to distinguish between non-defective articles and defective articles without any functional test. Furthermore, in the case where many semiconductor devices are wire bonded to a lead frame, vibration and breaking of wires of a defective semiconductor device adversely affects the wire bonding of adjacent non-defective semiconductor devices, and wires of non-defective semiconductor devices are liable to be broken.

SUMMARY OF THE INVENTION

Accordingly, it is an object of the present invention to provide wire bonding inspection equipment which is capable of automatically breaking bonding wires of defective semiconductor devices and automatically applying a mark, which is discernable even after sealing, on defective semiconductor devices.

In view of this and other objects the present invention provides wire bonding inspection equipment which is used in a wire bonding step for wire bonding a semiconductor device to a surrounding member, and used in a sealing step for sealing the semiconductor device, the improvement which comprises: a judging unit for judging whether or not wire bonding is acceptable and for producing a defect signal when the semiconductor device is judged defective; a breaking unit, in response to the defect signal, breaking wires of the defective semiconductor device; and defect mark applying unit for applying the defect mark on the defective semiconductor device in response to the defect signal, the defect mark applying unit being adapted to apply the defect a mark on an area other than an area to be covered with sealing material.

With such a construction, the inspection of wire bonding is automatically carried out, and hence erroneous detection of defective semiconductor devices by errors of workers is prevented. The defect mark is applied on an area other than an area to be covered with sealing material, and hence is visible from outside with ease even if the semiconductor device is sealed.

DETAILED DESCRIPTION OF THE PREFERRED EMBODIMENTS

Figure 1:
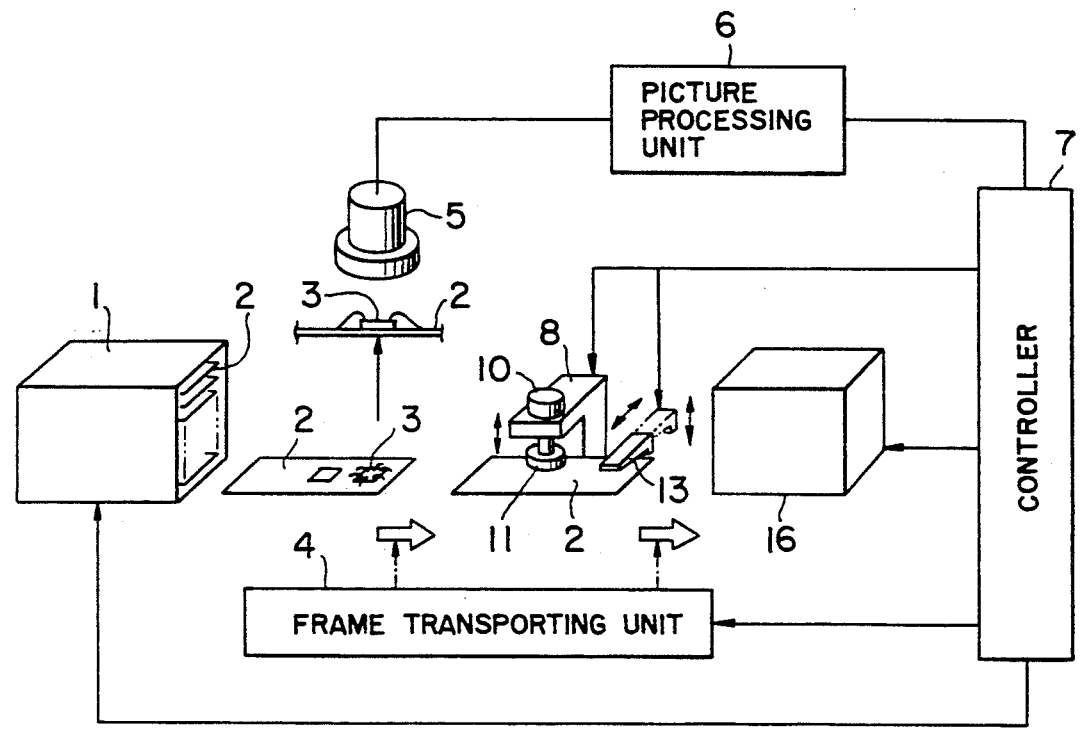
FIG. 1 is a diagrammatic view of wire bonding inspection equipment according to the present invention.

Wire bonding inspection equipment constructed according to the present invention will be described with reference to the drawings. In FIG. 1, a large number of lead frames 2 are received in a supply magazine 1. Each of the lead frames 2 has semiconductor devices 3 wire bonded to it. A frame conveyor 4 which includes a belt conveyor (not shown) removes lead frames 2 from the supply magazine 1 and then transports them to a predetermined position. An image pickup device 5 is provided to pick up an image of the wire bonding portion of each of the semiconductor devices 3 conveyed by the frame conveyor 4, and picture signals produced by the image pickup device 5 are sent to a conventional picture processing unit 6. The picture processing unit 6 includes a picture memory (not shown), and picture signals stored in the picture memory are processed according to commands of a controller 7, which includes a microprocessor. On the basis of output signals from the picture processing unit 6, the controller 7 makes a judgement as to whether or not the state of wire bonding of the lead frame 2 under test is acceptable, and further controls the sequence of the operation of the whole wire bonding inspection equipment.

Figure 2:
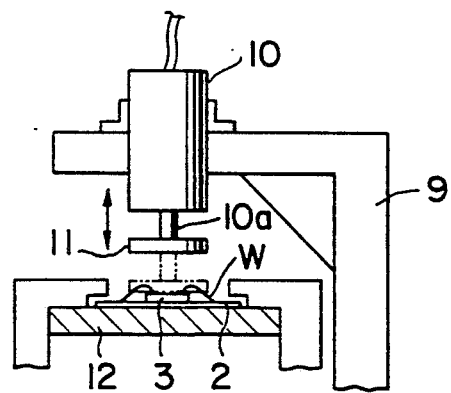
FIG. 2 is an enlarged front view of the wire breaking unit of FIG. 1.

Downstream of the image pickup device 5 there is provided a wire breaking unit 8 which breaks wires of a semiconductor device 3 having wire bonding state which is judged defective. As illustrated n FIG. 2, the wire breaking unit 8 includes an air cylinder 10 supported on a column 9, and a wire depressing disk 11 mounted to a piston 10a of the air cylinder 10 for vertical movement to crush each semiconductor device 3 on a lead frame 2 which is placed on a substrate 12.

Figure 3:
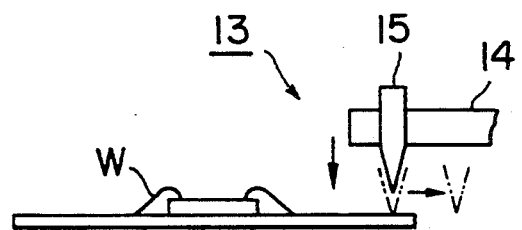
FIG. 3 is an enlarged front view of the defect mark applying unit of FIG. 1.

A defect mark applying unit 13 is arranged in the vicinity of and downstream of the wire breaking unit 8. As shown in FIG. 3, the defect mark applying unit 13 includes a supporting rod 14 and a scriber 15 supported at a distal end of the supporting rod 14.

Disposed closely downstream of the defect mark applying unit 13 is a discharge magazine 16 for accommodating inspected lead frames 2.

Figure 4:
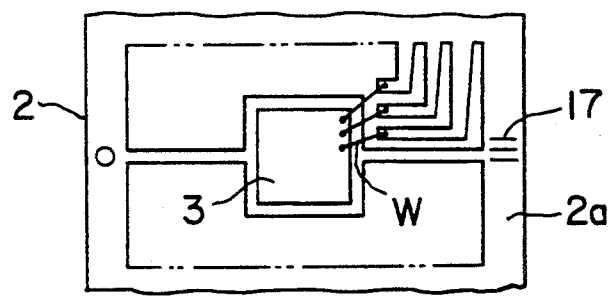
FIG. 4 is a plan view of a lead frame with a defect mark provided.

In operation, the frame conveyor 4 removes lead frames 2 from the supply magazine 1 and places them just below the image pickup device 5. The image pickup device 5 picks up an image of the wire bonding portion of each semiconductor device 3 to produce picture signals, which are conventionally processed in the picture processing unit 6 to provide picture processing result signals. On the basis of the picture processing result signals, the controller 7 judges whether or not the state of the wire bonding is acceptable. When the judgement is affirmative, the next semiconductor device 3 on the same lead frame is subjected to picture processing. When the judgement is negative, that is, the wire bonding of the semiconductor is defective, the defective semiconductor is conveyed and is placed in position just below the depressing disk 11 of the wire breaking unit 8. Then, the wire breaking unit 8 lowers the depressing disk 11 by actuating the air cylinder 10, so that all the wires W of the defective semiconductor 3 are depressed and broken by the depressing disk 11. Thereafter, the defective semiconductor device 3 is moved to the defect mark applying unit 13, in which the defect mark applying unit 13 provides by means of the scriber 15 a defect mark 17 at a visible position which is visible even if the defective semiconductor device is sealed with sealing material in the subsequent sealing step. As shown in FIG. 4, this position may be in an outer circumference 2a of the lead frame in the vicinity of the defective semiconductor device 3.

Then, the lead frame 2 is returned underneath the image pickup device 5 for taking an image of the next semiconductor device 3. When inspection of all the semiconductor devices 3 on one lead frame is completed, the inspected lead frame 2 is conveyed by the frame conveyor 4 for storage in the discharge magazine 16. Inspected lead frames 2 may also be returned to supply magazine 1.

Figure 5:
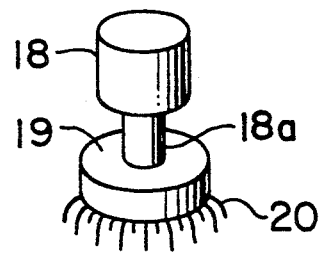
FIG. 5 is a perspective view of a replacement for the depressing disk of FIG. 2.

FIG. 5 illustrates a replacement for the depressing disk 11 of FIG. 1. This breaking portion 11A includes a motor 18 which is to be mounted on the piston 10a of the air cylinder 10 in place of the depressing disk 11. The motor 18 has a disk 19 mounted on an output shaft 18a thereof. The disk 19 is provided at outer circumferential portion thereof with many metallic wires 20 fixed to it. The metallic wires have sufficient strength and size as to cut bonded wires by rotating the disk 19.

The object of breaking the wires is to positively detect the defective semiconductor devices 3 by functional tests before shipment of the products. The wire breaking unit may have various breaking means other than the depressing disk 11 and wires 20, sufficient to achieve such an object.

In the preceding embodiment, defective semiconductor devices 3 are firstly conveyed to the wire breaking unit 8 for breaking wires W and then to the defect mark applying unit 13 for providing the defect mark 17. Defective semiconductor devices 3 may be first sent to the defect mark applying unit 13 and then to the wire breaking unit 8, or breaking of wires W and providing the defect mark 17 may be performed at the same time.

In the embodiment previously described, defective semiconductor devices 3 are moved to the wire breaking unit 8 and the defect mark applying unit 13 each time that the controller 9 judges them defective. All the semiconductor devices 3 of one lead frame may previously undergo the image pickup operation to judge whether or not they are acceptable, the result of the judgement being stored in the memory, and finally the lead frame is conveyed to the wire breaking unit 8 and the defect mark applying unit 13 to sequentially conduct breaking of the wires and applying the defect mark on all the semiconductor devices 3 which were judged defective.

What is claimed is:

1. Wire bonding inspection equipment which is used in a wire bonding step for wire bonding a semiconductor device to a surrounding member, and which is used in a sealing step for sealing said semiconductor device, comprising:
   judging means for judging whether or not wire bonding is acceptable and for producing a defect signal when said semiconductor device is judged to be defective;
   breaking means, responsive to said defect signal, for breaking wires of a defective semiconductor device; and
   defect mark applying means for applying a defect mark on said defective semiconductor device in response to said defect signal, said defect mark applying means applying said defect mark on an area of said defective semiconductor device other than an area designated to be covered with sealing material.

2. Wire bonding inspection equipment as recited in claim 1, wherein
   said defect mark applying means applies said defect mark after said breaking means breaks said wires.

3. Wire bonding inspection equipment as recited in claim 1, wherein said breaking means comprises:
   a pressing plate member for breaking all bonded wires of said defective semiconductor device; and
   means for moving said pressing plate member relative to said defective semiconductor device for breaking all wires of said defective semiconductor device.

4. Wire bonding inspection equipment as recited in claim 1, wherein said breaking means comprises:
   a motor;
   a disk, rotated by said motor, said disk having wires fixed thereto for breaking bonded wires of said defective semiconductor device; and
   means for moving said disk relative to said bonded wires of said defective semiconductor device for breaking said bonded wires of said defective semiconductor device.

* * * * *